United States Patent
Shimizu et al.

(10) Patent No.: US 9,971,342 B2
(45) Date of Patent: May 15, 2018

(54) PATTERN DATA CREATING METHOD, TEMPLATE, AND SEMICONDUCTOR DEVICE MANUFACTURING METHOD

(71) Applicant: TOSHIBA MEMORY CORPORATION, Tokyo (JP)

(72) Inventors: Mitsuko Shimizu, Tokyo (JP); Sachiko Kobayashi, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 523 days.

(21) Appl. No.: 14/630,672

(22) Filed: Feb. 25, 2015

(65) Prior Publication Data

US 2016/0064368 A1 Mar. 3, 2016

(30) Foreign Application Priority Data

Aug. 28, 2014 (JP) ................................. 2014-173802

(51) Int. Cl.
*G03F 7/00* (2006.01)
*G05B 19/418* (2006.01)

(52) U.S. Cl.
CPC ......... *G05B 19/418* (2013.01); *G03F 7/0002* (2013.01); *G05B 2219/45031* (2013.01)

(58) Field of Classification Search
None
See application file for complete search history.

(56) References Cited

U.S. PATENT DOCUMENTS

| | | | |
|---|---|---|---|
| 8,468,480 B2 | 6/2013 | Inanami et al. | |
| 8,475,702 B2 | 7/2013 | Furutono | |
| 2010/0190342 A1* | 7/2010 | Kotani | G06F 17/5081 438/694 |
| 2013/0069278 A1* | 3/2013 | Kobayashi | G03F 7/0002 264/319 |
| 2013/0162963 A1 | 6/2013 | Spruit et al. | |
| 2014/0346701 A1 | 11/2014 | Kobayashi et al. | |

FOREIGN PATENT DOCUMENTS

| | | |
|---|---|---|
| JP | 08-213296 | 8/1996 |
| JP | 2003-142367 | 5/2003 |
| JP | 2009-66773 | 4/2009 |
| JP | 2010-52288 | 3/2010 |

(Continued)

*Primary Examiner* — Paul Yanchus, III
(74) *Attorney, Agent, or Firm* — Finnegan, Henderson, Farabow, Garrett & Dunner, L.L.P.

(57) ABSTRACT

According to one embodiment, a pattern data creating method includes a calculation process, a determination process, and a correction process. In the calculation process, it is calculated a stress distribution of stresses that are applied to a template when a distance between the template and a substrate on which resist are disposed is predetermined, the template including a template pattern. In the determination process, it is determined whether or not there is a stress concentration spot in the template pattern at which a stress value larger than a predetermined criterion value is to appear. If the stress concentration spot is present, in the correction process, it is a corrected pattern data of the template pattern such that the stress value at the stress concentration spot becomes a stress value not larger than the predetermined criterion value.

14 Claims, 10 Drawing Sheets

(56) References Cited

FOREIGN PATENT DOCUMENTS

| | | |
|---|---|---|
| JP | 2011-029235 | 2/2011 |
| JP | 4792096 | 10/2011 |
| JP | 2013-69789 | 4/2013 |
| JP | 2013-131745 | 7/2013 |
| JP | 2013-145616 | 7/2013 |
| JP | 2013-163265 | 8/2013 |
| WO | WO 2011/155035 A1 | 12/2011 |

* cited by examiner

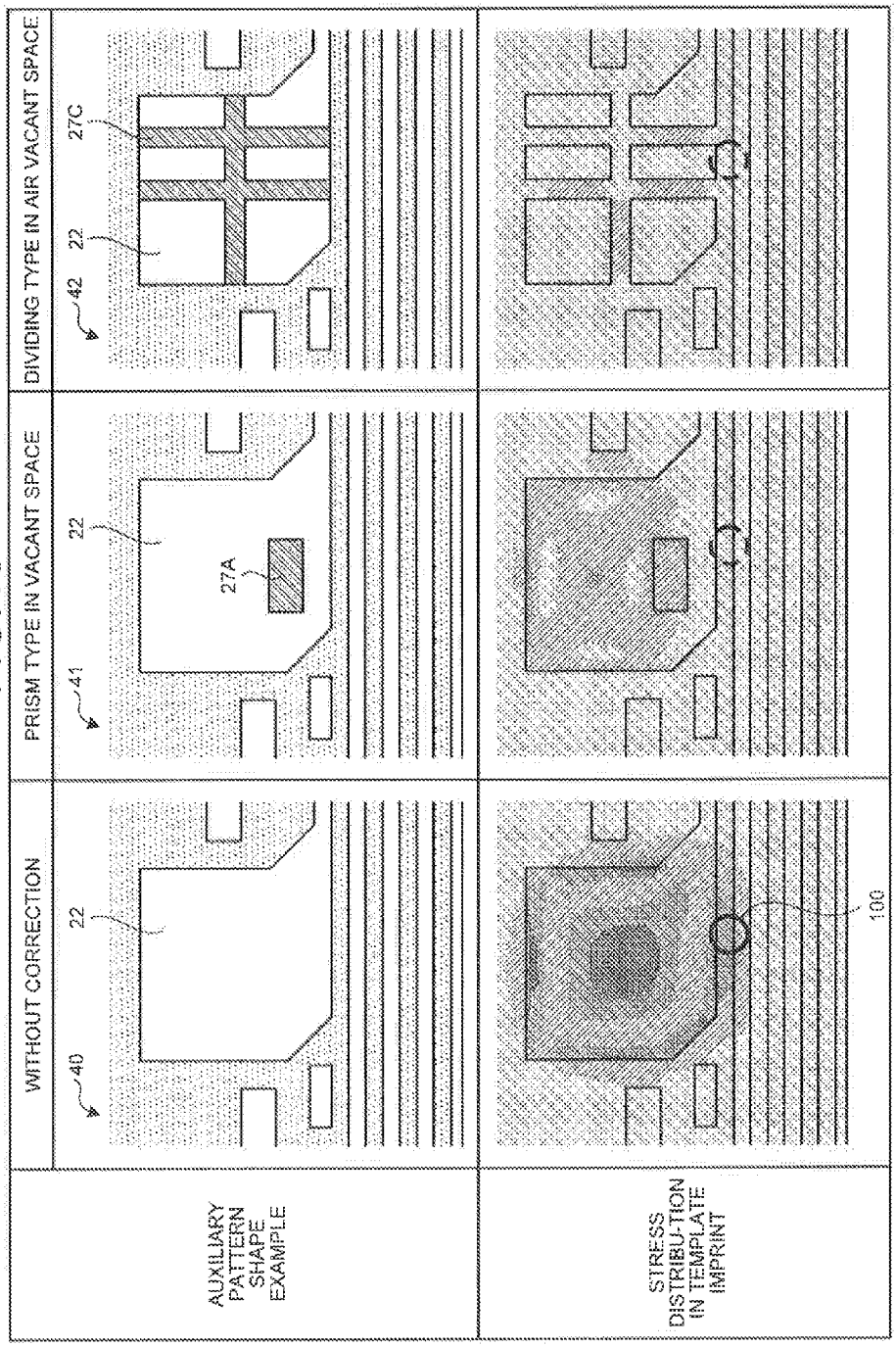

PATTERN DATA CREATING METHOD, TEMPLATE, AND SEMICONDUCTOR DEVICE MANUFACTURING METHOD

CROSS-REFERENCE TO RELATED APPLICATIONS

This application is based upon and claims the benefit of priority from Japanese Patent Application No. 2014-173802, filed on Aug. 28, 2014; the entire contents of which are incorporated herein by reference.

FIELD

An embodiment described herein relates generally to a pattern data creating method, template, and semiconductor device manufacturing method.

BACKGROUND

In recent years, an imprint method has attracted attentions as one of the processes used for forming semiconductor devices. In this imprint method, a template serving as an original mold is pressed onto a photo-setting organic material (resist) applied on a substrate. The resist is cured in this state, and then the template is removed from the cared resist to perform mold separation. Consequently, a resist pattern is formed on the substrate.

However, according to the imprint method, when the template is pressed on the resist, stresses are concentrated at certain areas of the template. Due to this, there is a case where the service life of the template is shortened. Accordingly, in the imprint method, it is desired to uniformize the stresses applied to the template when the template is pressed on the resist.

BRIEF DESCRIPTION OF THE DRAWINGS

FIG. 10 is a view for explaining changes in stress distribution by correction of a template pattern;

DETAILED DESCRIPTION

According to one embodiment, there is provided a pattern data creating method. The pattern data creating method includes a calculation process, a determination process, and a correction process. In the calculation process, it is calculated a stress distribution of stresses that are applied to a template when a distance between the template and a substrate on which resist are disposed is predetermined, the template including a template pattern. In the determination process, it is determined whether or not there is a stress concentration spot in the template pattern at which a stress value larger than a predetermined criterion value is to appear. If the stress concentration spot is present, in the correction process, it is a corrected pattern data of the template pattern such that the stress value at the stress concentration spot becomes a stress value not larger than the predetermined criterion value.

An exemplary embodiment of a pattern data creating method, template, and semiconductor device manufacturing method will be explained below in detail with reference to the accompanying drawings. The present invention is not limited to the following embodiment.

Embodiment

Figure 1:
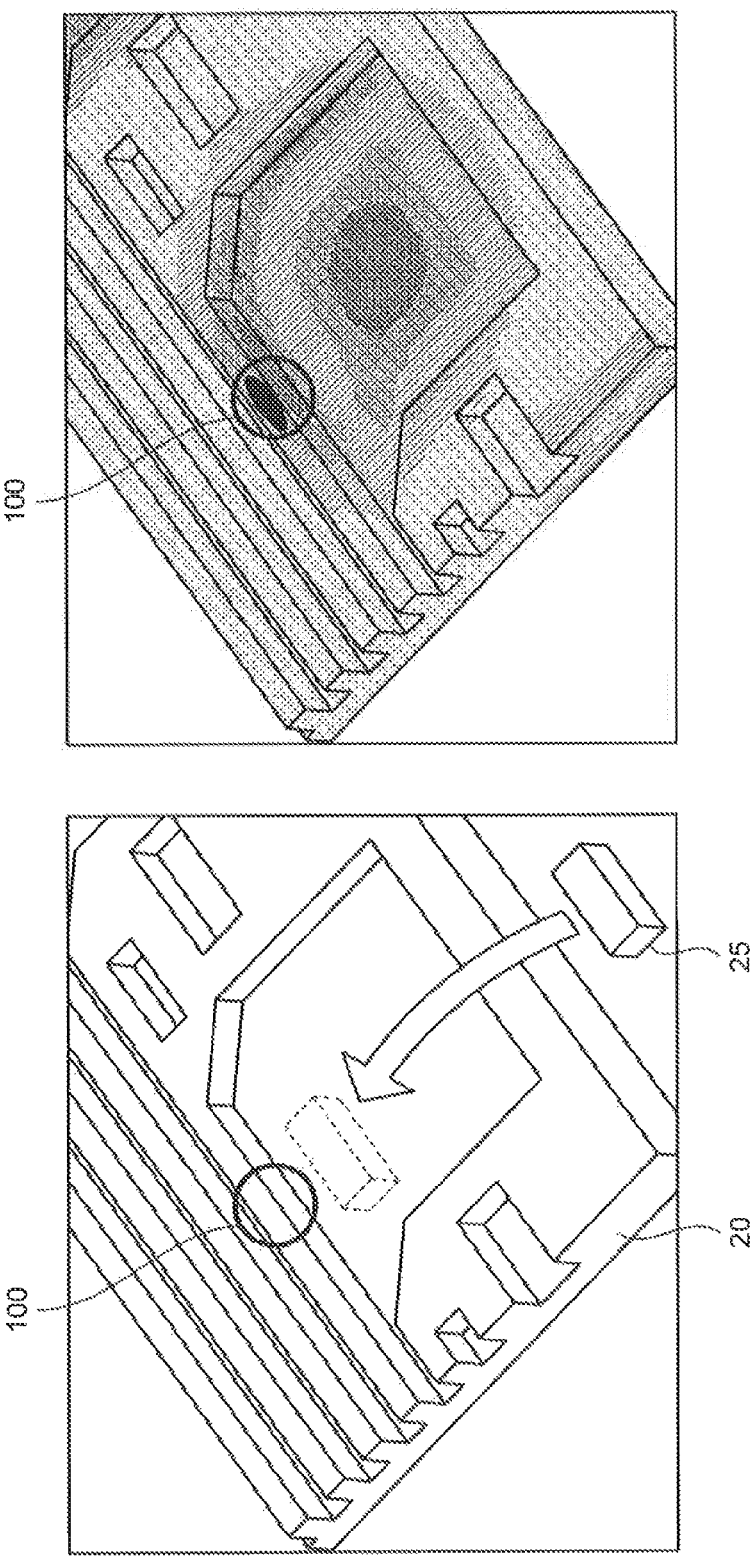
FIGS. 1A, 1B are views for explaining a concept of a pattern data creating method according to an embodiment.

FIGS. 1A, 1B are views for explaining a concept of a pattern data creating method according to an embodiment. In FIG. 1A is a perspective view showing a configuration of a template 20. In FIG. 1B is a view showing a stress distribution applied to the template 20 when the template 20 is pressed on a resist. In FIG. 1B, the denser the hatching at the position is, the larger the stress value is.

Hereinafter, a template before correction will be referred to as the template 20, and a template after correction will be referred to as a template 20X. Further, the pattern data of the template 20 will be referred to as template pattern data D, and the pattern data of the template 20X will be referred to as template pattern data Dx. Accordingly, the template 20 is a template formed by use of the template pattern data D, and the template 20X is a template formed by use of the template pattern data Dx.

Each of the templates 20 and 20X includes a template pattern formed of a rugged pattern arranged thereon. When the imprint process is performed, the template 20 or 20X is pressed on the resist, and so stresses are applied to the template 20 or 20X.

In this embodiment, based on a stress distribution applied to template 20, the template pattern data Dx of the template 20X is created. At this time, a correction is added to the template pattern data D created in advance, and the template pattern data Dx is thereby created such that it has relaxed stresses. Each piece of the template pattern data D and Dx is design data showing the shape of the template pattern, viewed from the upper face (patterned face) of the template 20 or 20X.

When the template pattern data Dx is created, the stress distribution on the template 20 is calculated in accordance with an imprint simulation using the template pattern data D before correction. The calculated stress distribution is the distribution of stresses to be applied to the template 20 when the template 20 is pressed on the resist.

Consequently, a spot on the template 20, at which a stress is generated to be larger than a predetermined value (threshold value) (predetermined criterion value), is estimated, (which will be referred as a stress concentration spot 100). Then, an auxiliary pattern (an assist pattern) 25 is provided near the stress concentration spot 100. The auxiliary pattern 25 is arranged at a position for uniformizing the stresses to be applied to the template 20 when the template 20 is pressed on the resist. In other words, the pattern data of the template pattern is corrected, such that the stress value at the stress concentration spot 100 becomes a stress value not larger than the threshold value.

For example, the auxiliary pattern 25 is removed by a process after the imprint. However, the auxiliary pattern 25 may be not removed by a process after the imprint. Further, in place of arranging the auxiliary pattern 25 on the template 20, the template pattern (design layout) of the template 20 may be altered.

In this embodiment, the auxiliary pattern 25 is provided to the template pattern corresponding to the template pattern data D before correction. Then, the template pattern data Dx provided with the auxiliary pattern 25 and so forth is used to form the actual template 20X. Thereafter, the template 20X is used to perform an imprint process to a transfer target substrate, such as a wafer Wa.

The template 20 or 20X is kept pressed on the resist from the time when the template 20 or 20X is brought into contact with the resist to the time when it is pulled away from the resist. Specifically, the template 20 or 20X is brought into contact with the resist, so the resist is filled in the template pattern, then the resist is cured, and then the template 20 or 20X is pulled away from the cured resist, during which the template 20 or 20X is kept pressed on the resist.

Figure 2:
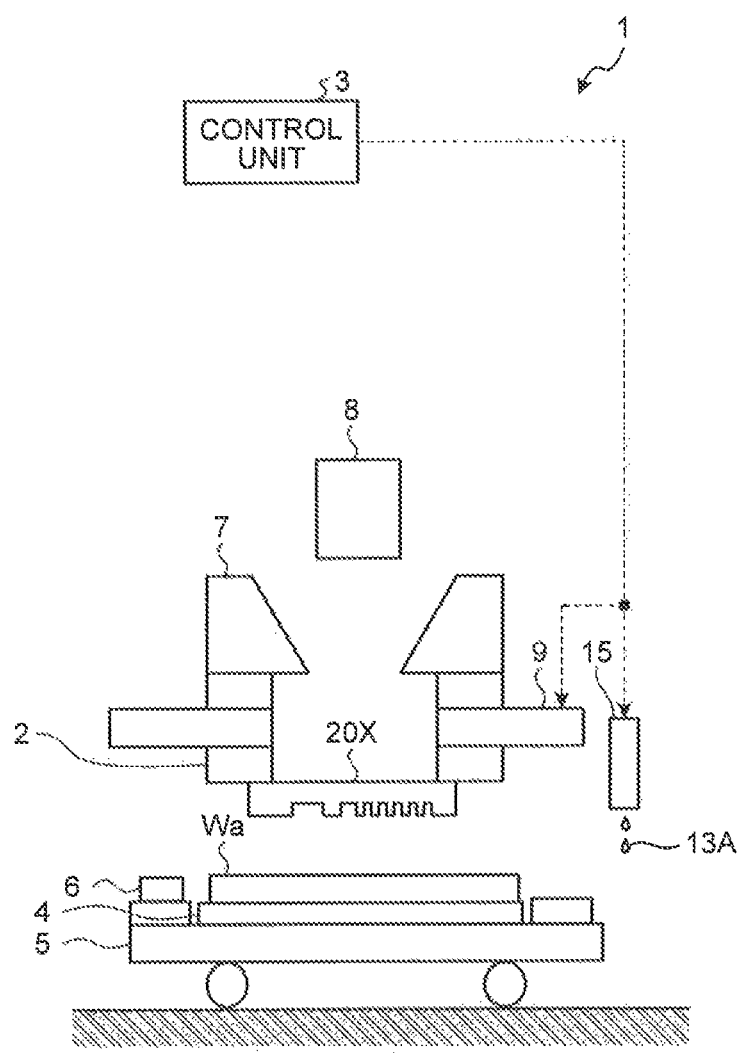
FIG. 2 is a view showing a configuration of an imprint apparatus.

FIG. 2 is a view showing a configuration of an imprint apparatus. The imprint apparatus 1 is an apparatus for transferring the template pattern of the template 20X serving as a mold plate to a transfer target substrate, such as a wafer Wa. The imprint apparatus 1 forms a pattern on the wafer Wa by an imprint method, such as an optical nano-imprint lithography method. The template 20X serves as an original mold, and the template pattern is a circuit pattern or the like to be transferred onto the wafer Wa. The template 20X is formed of a quartz glass substrate or the like.

The imprint apparatus 1 is equipped with an original plate stage 2, a control unit 3, a substrate chuck 4, a sample stage 5, a reference mark 6, an alignment sensor 7, a UV light source 8, a stage base 9, and a liquid dropping device 15.

The sample stage 5 supports the wafer Wa mounted thereon, and travels in a plane parallel to the wafer Wa mounted thereon. Further, the sample stage 5 moves the wafer Wa to a position below the liquid dropping device 15, when a resist 13A serving as a transfer material is dropped onto the wafer Wa. Further, the sample stage 5 moves the wafer Wa to a position below the template 20X, when the imprint process is performed to the wafer Wa.

Further, the substrate chuck 4 is arranged on the sample stage 5. The substrate chuck 4 fixes the wafer Wa at a predetermined position on the sample stage 5. Further, the reference mark 6 is arranged on the sample stage 5. The reference mark 6 is a mark for detecting the position of the sample stage 5, and is used for positioning the wafer Wa when the wafer Wa is loaded onto the sample stage 5.

The original plate stage 2 is arranged on the bottom of the stage base 9 to face the wafer Wa. The original plate stage 2 fixes the template 20X at a predetermined position by vacuum suction or the like, from the rear face side of the template 20X (the face side having no template pattern, formed thereon).

The stage base 9 supports the template 20X by the original plate stage 2, and presses the template pattern of the template 20X on the resist 13A on the wafer Wa. The stage base 9 travels in a vertical direction, so that it presses the template 20X onto the resist 13A, and it pulls the template 20X away from the resist 13A to perform mold separation. Further, the alignment sensor 7 is arranged on the stage base 9. The alignment sensor 7 is a sensor for detecting the position of the wafer Wa and for detecting the position of the template 20X.

The liquid dropping device 15 is a device for dropping the resist 13A onto the wafer Wa by means of an ink jet method. The liquid dropping device 15 is equipped with an ink jet head (not shown) including a plurality of micro pores for spouting liquid droplets of the resist 13A.

The UV light source 8 is a light source for radiating UV light, and is arranged above the stage base 9. The UV light source 8 radiates the UV light from above the template 20X in a state where the template 20X is pressed on the resist 13A.

The control unit 3 is connected to components of the imprint apparatus 1 to respectively control these components. FIG. 2 shows a scare where the control unit 3 is connected to the liquid dropping device 15 and the stage base 9, but omits showing the connection of the control unit 3 to the other components.

When the imprint is performed to the wafer Wa, the wafer Wa mounted on the sample stage 5 is moved to a position directly below the liquid dropping device 15. Then, the resist 13A is dropped onto a predetermined shot position of the wafer Wa.

After the resist 13A is dropped onto the wafer Wa, the wafer Wa mounted on the sample stage 5 is moved to a position directly below the template 20X. Then, the template 20X is pressed, onto the resist 13A on the wafer Wa.

The template 20X is kept in contact with the resist 13A for a predetermined time period, and then the UV light source 8 irradiates the resist 13A in this state with the UV light. Consequently, the resist 13A is cured, and the resist 13A on the wafer Wa is patterned with a transferred pattern corresponding to the template pattern. Thereafter, an imprint process for the subsequent shot is performed.

Next, an explanation will be given of a process sequence of the imprint process. FIGS. 3A to 3D are views for explaining a process sequence of the imprint process. FIGS. 3A to 3D are sectional views showing the wafer Wa or the template 20X and the wafer Wa, during the imprint process.

Figure 3A:
FIGS. 3A to 3D are views for explaining a process sequence of an imprint process.
Figure 3B:
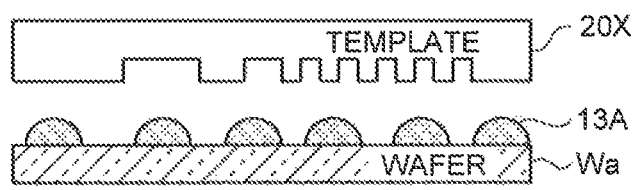
Figure 3C:
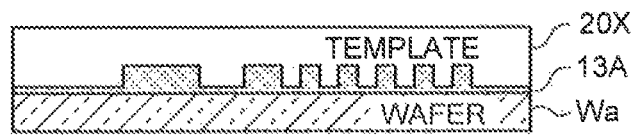

As shown in FIG. 3A, the resist 13A is dropped on the upper surface of the wafer Wa. Consequently, liquid droplets of the resist 13A dropped on the wafer Wa are spread ever the surface of the wafer Wa. Then, as shown in FIG. 3B, the template 20X is moved toward the resist 13A, and, as shown in FIG. 3C, the template 20X is pressed onto the resist 13A. In this way, when the template 20X, which has been formed by engraving a quartz substrate or the like, is brought into contact with the resist 13A, the resist 13A is caused to flow into the template pattern of the template 20X by a capillarity phenomenon.

Figure 3D:

The resist 13A is kept filled in the template 20X for a time period set in advance, and then it is irradiated with the UV light. Consequently, the resist 13A is cured. Then, as shown in FIG. 3D, the template 20X is removed from a cured resist pattern 13B to perform mold separation, and so the resist pattern 13B on the wafer Wa is shaped in the form, of reversal of the template pattern.

Figure 4:
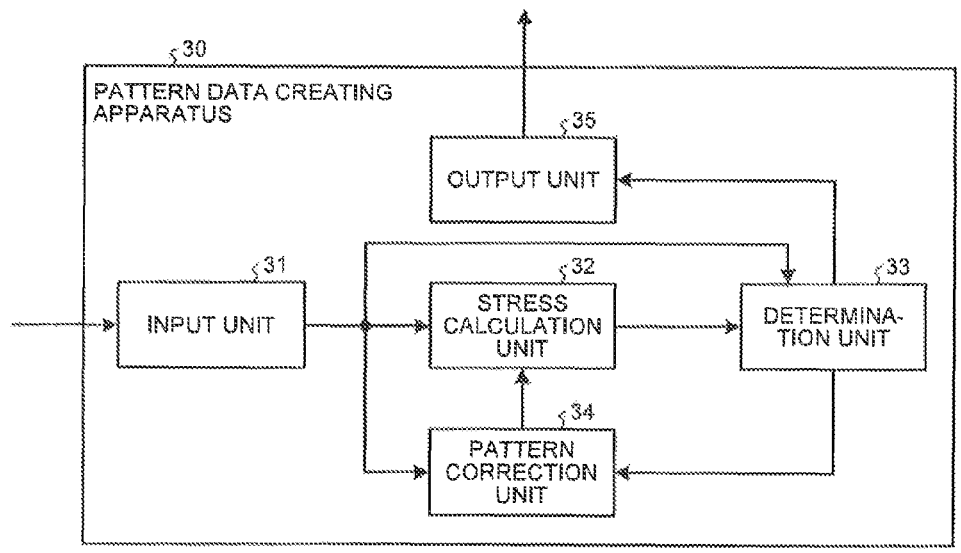
FIG. 4 is a view showing a configuration of a pattern data creating apparatus according to the embodiment.

FIG. 4 is a view showing a configuration of a pattern data creating apparatus according to the embodiment. The pattern data creating apparatus 30 includes a computer or the like configured to create the template pattern data Dx. The pattern data creating apparatus 30 creates the template pattern data Dx by adding the pattern data of an auxiliary pattern 25 to the template pattern data D before correction.

The pattern data creaming apparatus 30 may further add the pattern data of an auxiliary pattern 25 to the template pattern data Dx.

The pattern data creating apparatus 30 includes an input unit 31, a stress calculation unit 32, a determination unit 33, a pattern correction unit 34, and an output unit 35. The input unit 31 receives an input of template pattern data D before correction. Further, the input unit 31 receives inputs of a pattern correction instruction, a stress permissible value, pattern correction conditions (permissible ranges), and so forth.

The pattern correction instruction to be input to the input unit 31 is information for instructing a correction of the template pattern data D before correction or the template pattern data Dx. Further, the stress permissible value to be input to the input unit 31 is the upper limit stress value (threshold value) permissible for the template 20 or 20X. Further, the correction conditions to be input to the input unit 31 are conditions for correcting one template pattern data D before correction or the template pattern data Dx.

For example, the pattern correction conditions are constraint conditions to an auxiliary pattern 25. The constraint conditions to an auxiliary pattern 25 include a position at which the auxiliary pattern 25 can be arranged, a size and shape with which the auxiliary pattern 25 can be arranged, and so forth.

For example, the position at which the auxiliary pattern 25 can be arranged is defined by the distance between the template pattern and the auxiliary pattern 25 (a permissible range) and so forth. Consequently, the auxiliary pattern 25 is arranged at a position that is distant from the template pattern (projected pattern) (convex pattern) by a predetermined distance or more but is within a predetermined distance from the stress concentration spot 100.

For example, the position at which the auxiliary pattern 25 can be arranged is a position where the auxiliary pattern 25 does not affect the other part of the template pattern but can reduce the stress value at the stress concentration spot 100 to the threshold value or less. The distance between the template pattern and the auxiliary pattern 25 may be a distance that allows the auxiliary pattern 25 to be removed by a process performed after a light exposure process or the like.

Further, for example, the shape with which the auxiliary pattern 25 can be arranged is the aspect ratio of the auxiliary pattern 25 viewed from the upper face side. The aspect ratio is the ratio between the vertical dimension (in an X-direction) and the horizontal dimension (in a Y-direction) of the auxiliary pattern 25 viewed from the upper face side (in a Z-direction).

For example, the correction conditions are set for respective degrees of the stress value at the stress concentration spot 100. For example, when the stress value is a first stress value, first correction conditions are applied, and, when the stress value is an N-th stress value (N is a natural number), N-th correction conditions are applied.

For example, the correction conditions may include table data in which stress values and auxiliary patterns 25 are correlated with each other. In this case, the shape, the arrangement position, and so forth (permissible ranges) are set up in the auxiliary patterns 25 of the table data.

When the input unit 31 receives an input of template pattern data D before correction, it sends the template pattern data D before correction to the stress calculation unit 32 and the pattern correction unit 34. Further, when the input unit 31 receives an input of a pattern correction instruction, it sends the pattern correction instruction to the stress calculation unit 32. Further, when the input unit 31 receives an input of a stress permissible value, it sends the stress permissible value to the determination unit 33. Further, when the input unit 31 receives an input of pattern correction conditions, it sends the pattern correction conditions to the pattern correction unit 34.

Based on the template pattern data D before correction, the stress calculation unit 32 calculates the distribution of stresses to be applied to the template 20 (or the template pattern) when the template 20 is pressed on the resist 13A.

Further, when the stress calculation unit 32 receives the template pattern data Dx sent from the pattern correction unit 34, it calculates a stress distribution on the template 20. At this time, based on the template pattern data Dx, the stress calculation unit 32 calculates the distribution of stresses to be applied to the template 20X (or the template pattern) when the template 20X is pressed on the resist 13A.

For example, the stress calculation unit 32 calculates a stress distribution on the template 20 or template 20X by use of an imprint simulation. The stress calculation unit 32 sends the calculated stress distribution to the determination unit 33.

Based on the stress permissible value and the stress distribution calculated by the stress calculation unit 32, the determination unit 33 determines whether or not the stresses on the template 20 or template 20X are within the permissible range. If the stress distribution calculated by the stress calculation unit 32 includes a stress value (unsuitable stress value) larger than the stress permissible value, the determination unit 33 extracts this unsuitable stress value. Further, the determination unit 33 sets the position having the unsuitable stress value as a stress concentration spot 100.

The determination unit 33 correlates the unsuitable stress value with the stress concentration spot 100, and sends this correlation information as abnormal information to the pattern correction unit 34. On the other hand, if the stress distribution does not include any unsuitable stress value, the determination unit 33 sends the template pattern data Dx to the output unit 35.

The pattern correction unit 34 corrects the template pattern data D before correction, and thereby creates the template pattern data Dx. The pattern correction unit 34 may further corrects the template pattern data Dx to create new template pattern data Dx.

Based on the abnormal information and the pattern correction conditions, the pattern correction unit 34 creates the template pattern data Dx. If the template pattern data D before correction is sent to the pattern correction unit 34, the pattern correction unit 34 corrects the template pattern data D before correction. Further, If the template pattern data Dx is sent to the pattern correction unit 34, the pattern correction unit 34 corrects the template pattern data Dx.

The pattern correction unit 34 creates the template pattern data Dx by performing a process of arranging the auxiliary pattern 25. For example, the pattern correction unit 34 arranges the auxiliary pattern 25 near the stress concentration spot 100.

In place of arranging the auxiliary pattern 25, the pattern correction unit 34 may perform a process of altering the layout of the template pattern. In this case, based on the abnormal information, the pattern correction conditions, and the template pattern design rules, the pattern correction unit 34 alters the layout of the template pattern.

The pattern correction, unit 34 sends the created template pattern data Dx to the stress calculation unit 32. The output unit 35 outputs the template pattern data Dx, which has been sent from the determination unit 33, to an external apparatus or the like.

In the example described above, the pattern data creating apparatus 30 has a configuration including the stress calculation unit 32 and the determination unit 33. However, the stress calculation unit 32 may be configured separately from the pattern data creating apparatus 30. Further, the determination unit 33 may be configured separately from the pattern data creating apparatus 30.

Figure 5:
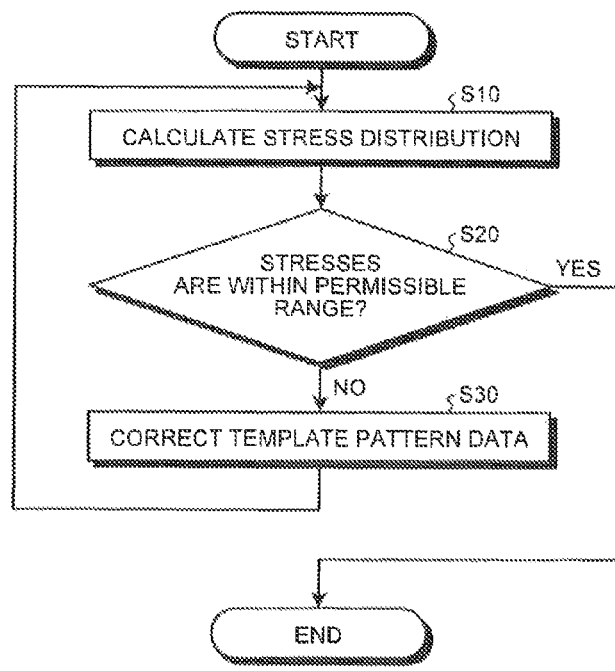
FIG. 5 is a flow chart showing a process sequence of a pattern data creating process according to the embodiment.

Next, an explanation will be given of a process sequence of a pattern data creating process according to the embodiment. FIG. 5 is a flow chart showing a process sequence of a pattern data creating process according to the embodiment. The input unit 31 of the pattern data creating apparatus 30 receives inputs of template pattern data D before correction, a pattern correction instruction, a stress permissible value, and pattern correction conditions.

Based on the template pattern data D before correction, the stress calculation unit 32 calculates the distribution of stresses to be applied to the template 20 when the template 20 is pressed on the resist 13A (step S10). For example, the stress calculation unit 32 calculates a stress distribution on the template 20 by use of an imprint simulation. The stress calculation unit 32 sends the calculated stress distribution to the determination unit 33.

Based on the stress permissible value and the stress distribution calculated by the stress calculation unit 32, the determination unit 33 determines whether or not the stress values on the template 20 are within the permissible range (step S20). In other words, the determination unit 33 determines whether or not the stress values on the template 20 include a value deviating from the threshold value. Specifically, the determination unit 33 determines whether or not the stress distribution calculated by the stress calculation unit 32 includes a stress value (unsuitable stress value) larger than the stress permissible value.

If an unsuitable stress value is included, the determination unit 33 extracts this unsuitable stress value. Then, the determination unit 33 sets the position in the template pattern having the unsuitable stress value as a stress concentration spot 100. The determination unit 33 correlates the unsuitable stress value with the stress concentration spot 100, and sends this correlation information as abnormal information to the pattern correction unit 34.

Thus, if there is a stress not within the permissible range (step S20, No), the template pattern data D before correction is corrected (step S30). In this way, the template pattern data D before correction is corrected, and template pattern data Dx is thereby created.

Specifically, based on the abnormal information and the pattern correction conditions, the pattern correction unit 34 creates the template pattern data Dx. At this time, the pattern correction unit 34 creates the template pattern data Dx by arranging an auxiliary pattern 25 on the template pattern corresponding to the template pattern data D before correction. For example, the pattern correction unit 34 arranges the auxiliary pattern 25 near the stress concentration spot 100.

Figure 6:
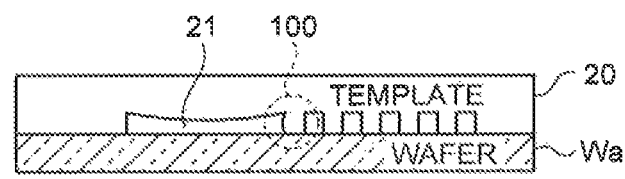
FIG. 6 is a view for explaining a stress concentration spot.

FIG. 6 is a view for explaining a stress concentration spot. FIG. 6 illustrates a sectional view of the template 20. The template 20 is a template produced by use of the template pattern data D before correction.

When the template 20 is pressed on the wafer Wa coated with the resist 13A (not shown in FIG. 6), the template 20 receives stresses applied thereto. For example, in the template pattern of the template 20, stresses are concentrated near a large vacant space (a recessed pattern region 21) (concave pattern). This spot where stresses are concentrated is the stress concentration spot 100.

Figure 7:
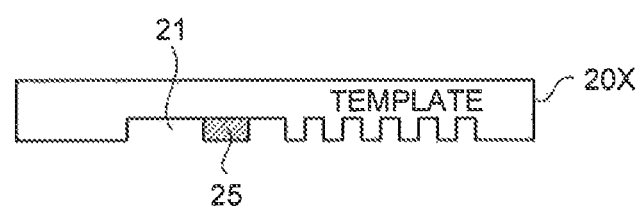
FIG. 7 is a view showing an arrangement example of an auxiliary pattern.

FIG. 7 is a view showing an arrangement example of an auxiliary pattern. FIG. 7 illustrates a sectional view of the template 20X. The template 20X is a template produced by use of the template pattern data Dx.

According to this embodiment, an auxiliary pattern 25 is arranged at a recessed pattern region 21 or the like where stresses are concentrated. For example, the auxiliary pattern 25 is arranged in that recessed region of the template pattern which is larger than a predetermined value.

For example, the auxiliary pattern 25 is arranged within a predetermined distance range from the stress concentration spot 100. The pattern data creating apparatus 30 creates the template pattern data Dx so that the auxiliary pattern 25 is arranged near the stress concentration spot 100. Thereafter, the template 20X is produced by use of the template pattern data Dx.

The auxiliary pattern 25 is a projected pattern having a height almost equal to that of the other part of the template pattern (projected pattern) in the template 20. Consequently, when the template 20X is pressed on the resist 13A, the auxiliary pattern 25 receives stresses applied thereto as in the other part of the template pattern. Consequently, the stresses applied to the template 20X are averaged.

The pattern correction unit 34 of the pattern data creating apparatus 30 creates the template pattern data Dx with the auxiliary pattern 25 arranged therein, and sends this template pattern data Dx to the stress calculation unit 32.

Thereafter, by use of the same methods as those used for the template pattern data D before correction, the determination process and the correction process as needed are performed for the template pattern data Dx. Specifically, based on the template pattern data Dx, the stress calculation unit 32 calculates the distribution of stresses to be applied to the template 20X when the template 20X is pressed on the resist 13A (step S10). Then, the stress calculation unit 32 sends the calculated stress distribution to the determination unit 33.

Based on the stress permissible value and the stress distribution calculated by the stress calculation unit 32, the determination unit 33 determines whether or not the stress values on the template 20X are within the permissible range (step S20). If an unsuitable stress value is included, the determination unit 33 sends abnormal information, which correlates the unsuitable stress value with the stress concentration spot 100, to the pattern correction unit 34.

Thus, if there is a stress not within the permissible range (step S20, No), the template pattern data Dx is further corrected (step S30). In this way, the template pattern data Dx is corrected, and new template pattern data Dx is thereby created.

Specifically, based on the abnormal information and the pattern correction conditions, the pattern correction unit 34 creates new template pattern data Dx. At this time, the pattern correction unit 34 creates the new template pattern data Dx by arranging an auxiliary pattern 25 on the template pattern corresponding to the template pattern data Dx.

Until the stresses to be applied to the template 20X fall within the permissible range, the pattern data creating apparatus 30 repeats the processes of the steps S10 to S30. When the stresses to be applied to the template 20X come to fall within the permissible range (step S20, Yes), the processes for creating the template pattern data Dx are completed.

Specifically, if the determination unit 33 makes a judgment that there is no unsuitable stress value included, it sends the template pattern data Dx to the output unit 35.

Then, the output unit 35 outputs the template pattern data Dx to an external apparatus or the like.

Next, an explanation will be given of the shape of the auxiliary pattern 25. FIGS. 8A to 8D are views showing shape examples of the auxiliary pattern. FIGS. 8A to 8D illustrate a top view of a template pattern. In FIGS. 8A to 8D, the portions with hatching indicate the template pattern (projected pattern), and the portions without hatching indicate the space pattern (recessed regions).

Figure 8A:
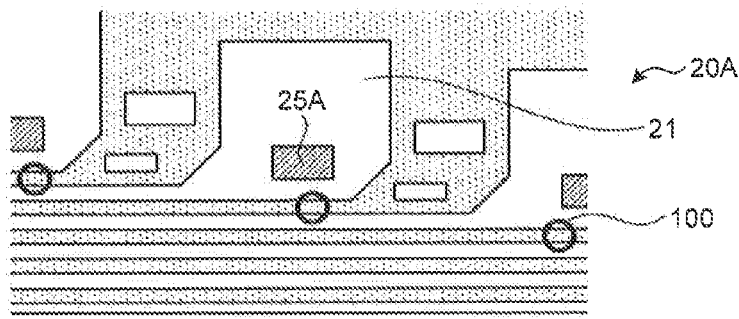
FIGS. 8A to 8D are views showing shape examples of the auxiliary pattern.

In FIG. 8A shows a template 20A as an example of the template 20. The template 20A is provided with auxiliary patterns 25A as an example of the auxiliary pattern 25. Each of the auxiliary patterns 25A consists of a single pattern. The auxiliary patterns 25A are arranged in recessed pattern regions 21 near respective stress concentration spots 100, such that each of the recessed pattern regions is provided with one auxiliary pattern.

For example, the auxiliary patterns 25A are arranged in parallel with line pattern of the template pattern. In other words, the auxiliary patterns 25A are arranged such that the longitudinal direction of the auxiliary patterns 25A is set in parallel with the longitudinal direction of the line pattern.

Figure 8B:
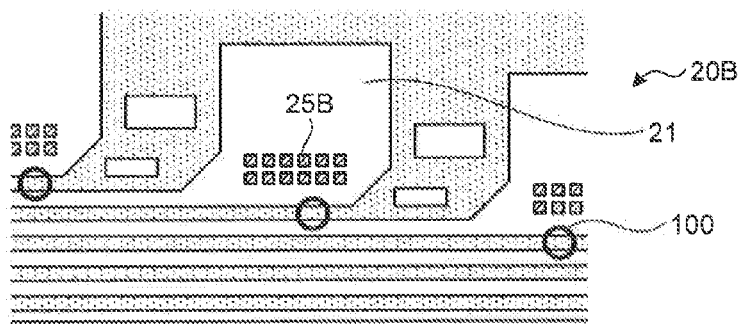

In FIG. 8B shows a template 20B as an example of the template 20. The template 20B is provided with auxiliary patterns 25B as an example of the auxiliary pattern 25.

Each of the auxiliary patterns 25B consists of a plurality of pattern portions smaller than a predetermined size. Accordingly, after the auxiliary patterns 25B are transferred onto the wafer Wa, the transferred patterns corresponding to the auxiliary patterns 25B can be easily removed from the wafer Wa. The auxiliary patterns 25B are arranged in recessed pattern regions 21 near respective stress concentration spots 100, such that each of the recessed pattern regions is provided with the plurality of pattern portions.

Figure 8C:
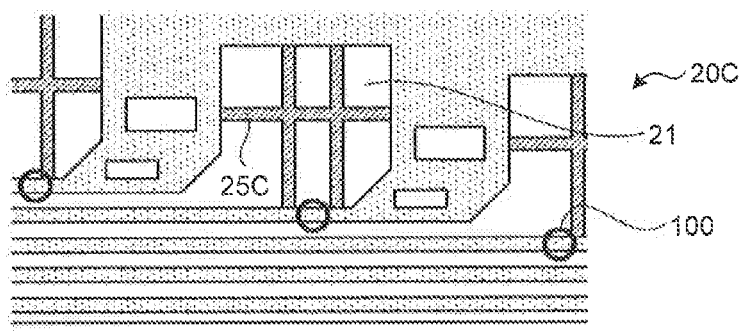

In FIG. 8C shows a template 20C as an example of the template 20. The template 20C is provided with auxiliary patterns 25C as an example of the auxiliary pattern 25. Each of the auxiliary patterns 25C consists of a projected pattern arranged to divide an vacant space (recessed region) of the template pattern. Each of the auxiliary patterns 25C includes line pattern portions. The auxiliary patterns 25C are arranged in recessed pattern regions 21 near respective stress concentration spots 100, such that each of the recessed pattern regions is provided with one or more line pattern portions.

Figure 8D:
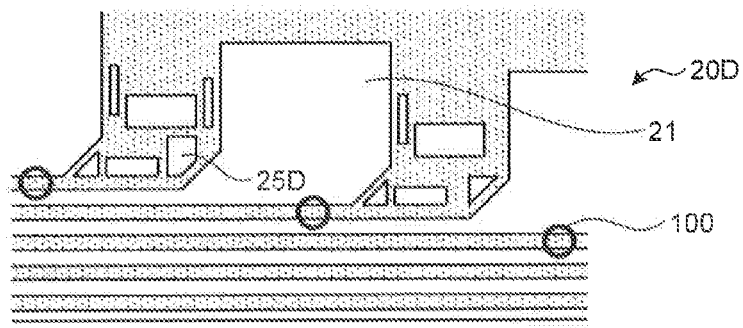

In FIG. 8D shows a template 20D as an example of the template 20. The template 20C is provided with auxiliary patterns 25D as an example of the auxiliary pattern 25. Each of the auxiliary patterns 25D consists of a space pattern (recessed pattern). The auxiliary patterns 25D are arranged in projected pattern regions near respective stress concentration spots 100, such that each of the projected pattern regions is provided with one or more space pattern portions.

The pattern correction unit 34 creates the template pattern data Dx by adding pattern data, which corresponds to any or some of the auxiliary patterns 25A to 25D described above, to the template pattern data D.

Each of the templates 20A to 20D may be designed such that the portions with hatching indicate a space pattern (recessed regions). In this case, each of the templates 20A to 20D is designed such that the portions without hatching indicate the template pattern (projected pattern). Further, in this case, the templates 20A to 20C are respectively provided with the auxiliary patterns 25A to 25C arranged as recessed patterns in projected pattern regions. On the other hand, the template 20D is provided with the auxiliary patterns 25D arranged as projected patterns in recessed pattern regions.

Further, the pattern correction unit 34 may perform a process of altering the layout of the template pattern to the template pattern data D before correction or the template pattern data Dx.

Figure 9:
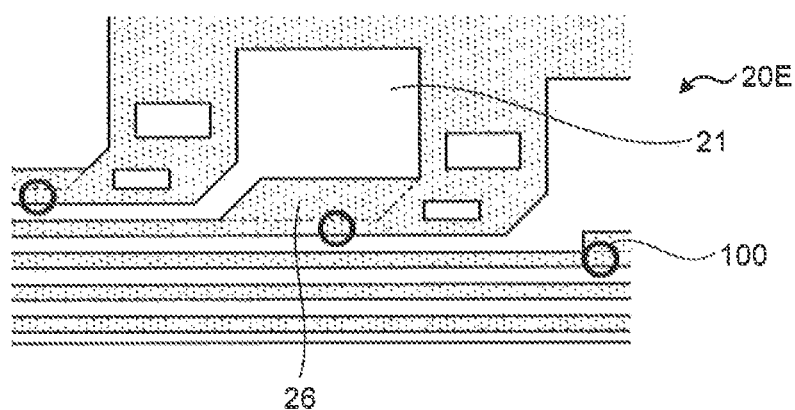
FIG. 9 is a view for explaining a process of altering the layout of a template pattern.

FIG. 9 is a view for explaining a process of altering the layout of a template pattern. In FIG. 9, the portions with hatching indicate the template pattern, and the portions without hatching indicate the space pattern.

FIG. 9 shows a template 20E as an example of the template 20. The layout of the template 20E is altered such that template pattern portions 26 near respective stress concentration spot 100 are fatter. Consequently, the stresses to be applied to the template 20E are averaged. It should be noted that the process of altering the layout of the template pattern is not limited to the process of making a portion of the template pattern fatter, but can be any process of altering the layout of the template pattern.

Next, an explanation will be given of changes in stress distribution (to relax the stresses) by correction of a template pattern. FIG. 10 is a view for explaining changes in stress distribution by correction of a template pattern. FIG. 10 illustrates the relationship between the upper face shape of an auxiliary pattern and a stress distribution in template imprint.

FIG. 10 shows a template pattern 40 without correction (before correction), a template pattern 41 provided with an auxiliary pattern 27A of a prism type (having a projected shape) in a vacant space, and a template pattern 42 provided with an auxiliary pattern 27C of a dividing type in a vacant space.

The auxiliary pattern 27A of a prism type in a vacant space is one prism-like template pattern arranged in each recessed pattern region (vacant space) 22 as in the auxiliary pattern 25A. The auxiliary pattern 27C of a dividing type in a vacant space is a template pattern arranged to divide each recessed pattern region (vacant space) 22 as in the auxiliary pattern 25C.

In the template pattern 40 without correction, there is a stress concentration spot 100. On the other hand, in the template pattern 41, the stress concentration spot 100 is vanished by the auxiliary pattern 27A arranged near the stress concentration spot 100. Similarly, in the template pattern 42, the stress concentration spot 100 is vanished by the auxiliary pattern 27C arranged near the stress concentration spot 100.

Next, an explanation will be given of a method of removing a portion formed by transferring an auxiliary pattern 25 to a wafer Wa (which will be referred to as a transferred auxiliary pattern 50, hereinafter). FIGS. 11A to 11F are views for explaining a process sequence of removing a transferred auxiliary pattern. FIGS. 11A to 11F illustrate a sectional view of the wafer Wa.

Figure 11A:
FIGS. 11A to 11F are views for explaining a process sequence of removing a transferred auxiliary pattern.
Figure 11B:
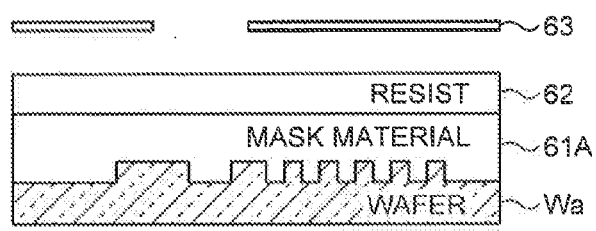

As shown in FIG. 11A, the transferred auxiliary pattern 50 that corresponds to an auxiliary pattern 25 is formed on the wafer Wa. Thereafter, as shown in FIG. 11B, a mask material 61A is provided on the wafer Wa, and a resist 62 is applied onto the mask material 61A. Then, light exposure is performed to the resist 62 by use of a photo mask 63 having an opening pattern larger than the transferred auxiliary pattern 50. This opening pattern is arranged at a position corresponding to the transferred auxiliary pattern 50.

Figure 11C:

Thereafter, the resist 62 is developed, so that the resist 62 is partly removed at a position corresponding to the opening pattern. Consequently, a resist pattern is formed such that it has an opening pattern above the transferred auxiliary pattern 50. Then, etching is performed from above this resist pattern, so that the mask material 61A is partly opened at a position corresponding to the opening position of the resist pattern. Consequently, as shown in FIG. 11C, a mask material pattern 61B having an opening pattern is formed on the transferred auxiliary pattern 50.

Figure 11D:
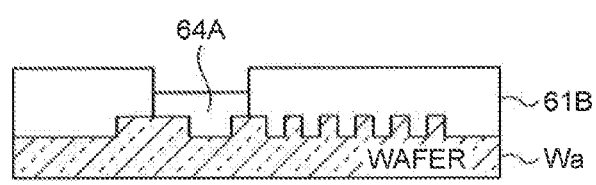

Then, as shown in FIG. 11D, a filling material 64 is embedded into the opening portion of the mask material pattern 61B, so that the transferred auxiliary pattern 50 is filled with the filling material 64A.

Figure 11E:
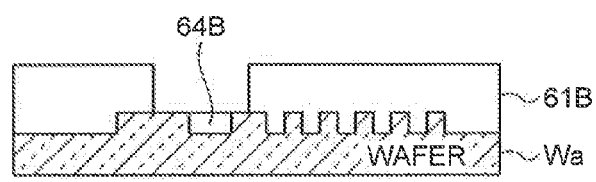

Further, the filling material 64A is etched back, so that a filling material 64B is left in the transferred auxiliary pattern 50 and the other part of the filling material is removed, as shown in FIG. 11E.

Figure 11F:

Then, the mask material pattern 61B is removed from the wafer Wa, so that a pattern excluding the transferred auxiliary pattern 50 is formed on the wafer, as shown in FIG. 11F. It should be noted that the transferred auxiliary pattern 50 may be removed from the wafer Wa by a method other than the method explained with reference to FIGS. 11A to 11F.

The creating process of template pattern data Dx is performed, for example for every layer in a wafer process. Then, the created template pattern data Dx is used to produce a template 20X. Further, the produced template 20X is used to manufacture semiconductor devices (semiconductor integrated circuits).

Thereafter, the template 20X is used to perform an imprint process to a wafer coated with a resist. Consequently, a resist pattern is formed on the wafer. Then, the layer below the resist pattern is etched while the resist pattern is used as a mask. Consequently, an actual pattern corresponding to the resist pattern is formed on the wafer. When semiconductor devices are manufactured, the creating process of template pattern data Dx, the producing process of a template 20X, the imprint process, and the etching process are repeated for every layer.

Figure 12:
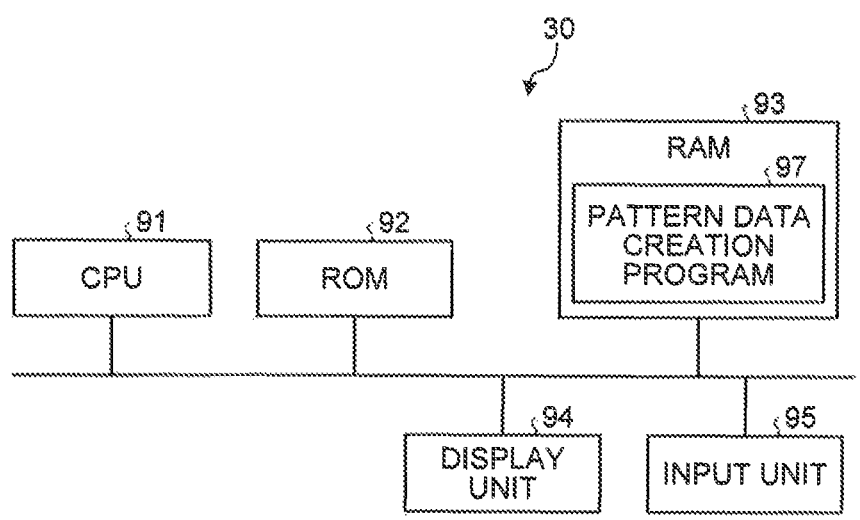
FIG. 12 is a view showing a hardware configuration of the pattern data creating apparatus.

Next, an explanation will be give of a hardware configuration of the pattern data creating apparatus 30. FIG. 12 is a view showing a hardware configuration of the pattern data creating apparatus. The pattern data creating apparatus 30 includes a CPU (Central Processing Unit) 91, a ROM (Read Only Memory) 92, a RAM (Random Access Memory) 93, a display unit 94 and an input unit 95. In the pattern data creating apparatus 30, the CPU 91, the ROM 92, the RAM 93, the display unit 94, and the input unit 95 are connected to each other through a bus line.

The CPU 91 creates the template pattern data Dx by use of a pattern data creation program 97 that is a computer program. The pattern data creation program 97 is a computer program product to be executed by a computer, wherein the computer program product includes a plurality of instructions for creating the template pattern data Dx, and it includes a nontransitory recording medium (nontransitory computer readable medium) that can be read by the computer. In the pattern data creation program 97, the plurality of instructions cause the computer to perform creation of the template pattern data Dx.

The display unit 94 is a display unit, such as a liquid crystal monitor, and is configured to display the template pattern data D before correction, the template pattern data Dx, the stress permissible value, the pattern correction conditions, the stress distribution, and so forth, based on instructions from the CPU 91.

The input unit 95 includes a mouse and a keyboard, and is configured to input instruction information (such as parameters necessary for creating pattern data), which is externally input by a user. The instruction information input into the input unit 95 is sent to the CPU 91.

The pattern data creation program 97 is stored in the ROM 92, and can be loaded into the RAM 93 through the bus line. FIG. 12 shows a state where the pattern data creation program 97 has been loaded in the RAM 93.

The CPU 91 executes the pattern data creation program 97 loaded in the RAM 93. Specifically, the pattern data creating apparatus 30 is configured such that, in accordance with an instruction input by a user through the input unit 93, the CPU 91 reads the pattern data creation program 97 from the ROM 92, and develops it in a program storing region inside the RAM 93 to execute various processes. The CPU 91 temporarily stores various data generated during these various processes in a data storing region formed inside the RAM 93.

The pattern data creation program 97 executed in the pattern data creating apparatus 30 has a module configuration including the stress calculation unit 32, the determination unit 33, and the pattern correction unit 34, so that they are loaded into the main memory device and is generated on the main memory device.

It should be noted that the pattern data creation program 97 may not include the function of the stress calculation unit 32. In this case, the stress distribution is calculated by a computer program other than the pattern data creation program 97.

Further, the pattern data creation program 97 may not include the function of the determination unit 33. In this case, a computer program other than the pattern data creation program 97 is used to determine whether or not the stresses on the template 20 or 20X are within the permissible range.

As described above, the embodiment includes calculating a stress distribution of stresses to be applied to the template 20 when the template 20 is pressed on the resist 13A. Then, it determines whether or not there is a stress concentration spot 100 in the template pattern where a stress value is larger than the threshold value. Further, if a stress concentration spot 100 is present, it corrects the template pattern data D to create the template pattern data Dx, such that the stress value at the stress concentration spot 100 becomes a stress value not larger than the threshold value. Accordingly, it is possible to uniformize the stresses to be applied to the template 20X when the template 20X is pressed on the resist 13A.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern data creating method comprising:
    calculating a stress distribution of stresses that are applied to a template when a distance between the template and a substrate on which resist is disposed is predetermined, the template including a template pattern;
    determining whether or not there is a stress concentration spot in the template pattern at which a stress value larger than a predetermined criterion value is to appear; and,
    if the stress concentration spot is present, correcting pattern data of the template pattern by adding an auxiliary pattern to the template pattern such that the stress value at the stress concentration spot becomes a stress value not larger than the predetermined criterion value, the auxiliary pattern being a projected pattern that divides a recessed region of the template pattern.

2. The pattern data creating method according to claim 1, comprising:
performing the calculating and the determining to a corrected pattern data; and
repeating the calculating, the determining, and the correcting, until a stress value at the stress concentration spot becomes a stress value not larger than the predetermined criterion value.

3. The pattern data creating method according to claim 1, wherein the auxiliary pattern has a height equal to that of a projected pattern of the template pattern.

4. The pattern data creating method according to claim 1, wherein the auxiliary pattern is a pattern to be transferred onto a substrate by an imprint process and to be removed from the substrate by a process after the imprint process.

5. The pattern data creating method according to claim 1, wherein the auxiliary pattern is arranged at a position distant from a projected pattern of the template pattern by a predetermined distance or more.

6. The pattern data creating method according to claim 1, wherein the auxiliary pattern comprises an auxiliary pattern arranged for the stress concentration spot, in a one-to-one relationship.

7. The pattern data creating method according to claim 1, wherein the auxiliary pattern comprises a plurality of auxiliary pattern portions smaller than a predetermined size and arranged for the stress concentration spot.

8. The pattern data creating method according to claim 1, wherein the auxiliary pattern is arranged in a recessed region of the template pattern, which are larger than a predetermined value.

9. The pattern data creating method according to claim 1, wherein when the pattern data is corrected, a pattern layout of the template pattern is altered.

10. A template comprising:
a template pattern having an auxiliary pattern,
wherein the auxiliary pattern is arranged such that a stress value that is applied to the template pattern when a distance between the template pattern and a substrate on which resist is disposed is predetermined becomes a stress value not larger than a predetermined criterion value, the auxiliary pattern being a projected pattern that divides a recessed region of the template pattern.

11. The template according to claim 10, wherein the auxiliary pattern is arranged at a position distant from a projected pattern of the template pattern by a predetermined distance or more.

12. The template according to claim 10, wherein the auxiliary pattern comprises an auxiliary pattern arranged for one stress concentration spot, in a one-to-one relationship, and wherein the stress concentration spot is part of the template pattern at which a stress value larger than the predetermined criterion value is to appear when the distance between the template pattern and the substrate is the predetermined distance if the auxiliary pattern is not arranged.

13. The template according to claim 10, wherein the auxiliary pattern comprises a plurality of auxiliary pattern portions smaller than a predetermined size and arranged for one stress concentration spot, and wherein the stress concentration spot is part of the template pattern at which a stress value larger than the predetermined criterion value is to appear when the distance between the template pattern and the substrate is the predetermined distance if the auxiliary pattern is not arranged.

14. A semiconductor device manufacturing method comprising:
calculating a stress distribution of stresses that are applied to a first template when a distance between the first template and a substrate on which resist is disposed is predetermined, the first template including a template pattern;
determining whether or not there is a stress concentration spot in the template pattern by adding an auxiliary pattern to the template pattern at which a stress value larger than a predetermined criterion value is to appear;
if the stress concentration spot is present, correcting pattern data of the template pattern such that the stress value at the stress concentration spot becomes a stress value not larger than the predetermined criterion value;
producing a second template by use of the corrected pattern data; and
performing an imprint process on the substrate by use of the second template, the auxiliary pattern being a projected pattern that divides a recessed region of the template pattern.

* * * * *